(12) United States Patent
Jo et al.

(10) Patent No.: US 12,500,196 B2
(45) Date of Patent: Dec. 16, 2025

(54) SEMICONDUCTOR PACKAGE WITH HYBRID WIRE BOND AND BUMP BOND CONNECTIONS

(71) Applicant: Micron Technology, Inc., Boise, ID (US)

(72) Inventors: Youngkwon Jo, Meridian, ID (US); Won Joo Yun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 514 days.

(21) Appl. No.: 17/813,825

(22) Filed: Jul. 20, 2022

(65) Prior Publication Data

US 2024/0030171 A1    Jan. 25, 2024

(51) Int. Cl.
*H01L 23/00* (2006.01)

(52) U.S. Cl.
CPC .............. *H01L 24/16* (2013.01); *H01L 24/48* (2013.01); *H01L 2224/04042* (2013.01); *H01L 2224/48091* (2013.01); *H01L 2224/48227* (2013.01); *H01L 2224/73265* (2013.01)

(58) Field of Classification Search
CPC ...................... H01L 24/16; H01L 24/48; H01L 2224/73257; H01L 2224/04042; H01L 2224/48091; H01L 2224/48227; H01L 2224/73265
See application file for complete search history.

(56) References Cited

U.S. PATENT DOCUMENTS

| | | | | |
|---|---|---|---|---|
| 5,340,771 A | * | 8/1994 | Rostoker | H01L 23/49833 257/E21.511 |
| 2003/0230801 A1 | * | 12/2003 | Jiang | H01L 23/49805 257/E25.023 |
| 2022/0059519 A1 | * | 2/2022 | Lee | H01L 24/73 |
| 2022/0068778 A1 | * | 3/2022 | Leslie | H01L 25/0657 |

* cited by examiner

*Primary Examiner* — Walter H Swanson
(74) *Attorney, Agent, or Firm* — Harrity & Harrity, LLP

(57) ABSTRACT

Implementations described herein relate to various structures, integrated assemblies, and memory devices. In some implementations, a semiconductor package may include a substrate having a first plurality of substrate bond pads and a second plurality of substrate bond pads, and a semiconductor die having a first plurality of die bond pads and a second plurality of die bond pads. Each die bond pad, included in the first plurality of die bond pads, may be connected to a corresponding substrate bond pad, included in the first plurality of substrate bond pads, using bump bonding, and each die bond pad, included in the second plurality of die bond pads, may be connected to a corresponding substrate bond pad, included in the second plurality of substrate bond pads, using wire bonding.

25 Claims, 10 Drawing Sheets

US 12,500,196 B2

SEMICONDUCTOR PACKAGE WITH HYBRID WIRE BOND AND BUMP BOND CONNECTIONS

TECHNICAL FIELD

The present disclosure generally relates to semiconductor devices and methods of forming semiconductor devices. For example, the present disclosure relates to a semiconductor package with hybrid wire bond and bump bond connections.

BACKGROUND

A semiconductor package includes a casing that contains one or more semiconductor devices, such as integrated circuits. Semiconductor device components may be fabricated on semiconductor wafers before being diced into die and then packaged. A semiconductor package protects internal components from damage and includes means for connecting internal components to external components (e.g., a circuit board), such as via balls, pins, or leads. A semiconductor package may include one or more semiconductor die electrically coupled to a substrate, such as a printed circuit board (PCB). A semiconductor die may be electrically coupled to a substrate (e.g., PCB) using wire bonding, bump bonding, or a similar bonding technique. A semiconductor package is sometimes referred to as a semiconductor device assembly.

BRIEF DESCRIPTION OF THE DRAWINGS

FIG. 2A is a bottom view of a semiconductor die. FIG. 2B is a bottom view of a semiconductor package including the semiconductor die of FIG. 2A and a substrate. FIG. 2C is a side cross-sectional view along the line 2C-2C of FIG. 2B.

FIG. 3A is a view of a semiconductor die. FIG. 3B is a bottom view of a semiconductor package including the semiconductor die of FIG. 3A and a substrate. FIG. 3C is a side cross-sectional view along the line 3C-3C of FIG. 3B.

DETAILED DESCRIPTION

Memory devices and similar components may include one or more semiconductor packages, also referred to as semiconductor device assemblies. At a high level, a semiconductor package may include one or more semiconductor devices, such as integrated circuits or similar components. A semiconductor device may include one or more semiconductor die electrically coupled to a substrate, such as a printed circuit board (PCB) or a similar substrate. A semiconductor die may be electrically coupled to a substrate (e.g., PCB) using wire bonding, bump bonding (sometimes referred to as direct chip attachment (DCA) bonding), or a similar bonding technique.

With the development of memory processing technology, semiconductor dies are shrinking. Due to the decrease in the semiconductor die size, bond pads at the semiconductor die are located nearer to one another, and signal traces within the substrate (e.g., PCB), which may be used for connecting bond pads of the semiconductor die to the substrate, are becoming more complex, leading to an increase in capacitance associated with signal traces. This may result in an attenuated signal input to the bond pads at the semiconductor die and/or parasitic effects at the bonding locations on the semiconductor die, making high-speed operation of a memory device or other device incorporating a semiconductor package difficult. Thus, as semiconductor dies continue to shrink, signal integrity may continually degrade, leading to reduced operational speeds of memory device or similar devices.

Figure 1:
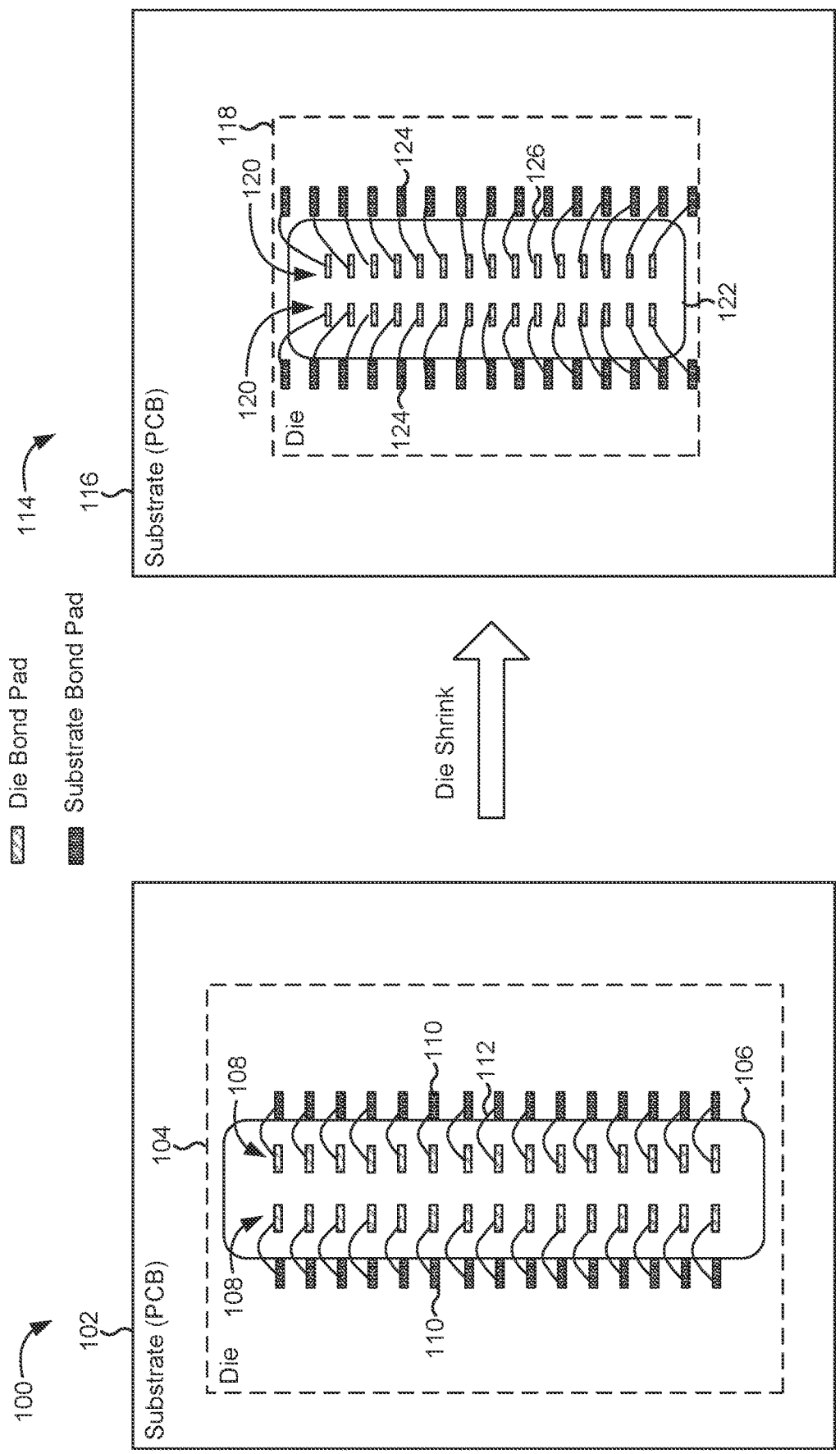
FIG. 1 is a diagram illustrating an example of wire bonding a semiconductor die to a substrate.

This may be more readily understood with reference to FIG. 1, which schematically illustrates a problem encountered in association with a shrinking semiconductor die. More particularly, FIG. 1 is a diagram illustrating an example of wire bonding a semiconductor die to a substrate. First, FIG. 1 shows an example semiconductor device 100, which may be a semiconductor package, a semiconductor device assembly, or a device or component otherwise associated with a semiconductor package or a semiconductor device assembly. In some aspects, the semiconductor device 100 may be a component of a memory device, such as a random access memory (RAM) device, a read only memory (ROM) device, a dynamic RAM (DRAM) device, a static RAM (SRAM) device, a synchronous dynamic RAM (SDRAM) device, a ferroelectric RAM (FeRAM) device, a magnetic RAM (MRAM) device, a resistive RAM (RRAM) device, a holographic RAM (HRAM) device, a flash memory device (e.g., a NAND memory device or a NOR memory memory), and others.

The semiconductor device 100 may include a substrate 102, such as a PCB or a component thereof, and one or more semiconductor die 104 electrically bonded to the substrate 102. In some examples, the substrate 102 may include a hole 106 or a similar opening for providing access to electrical connections of the semiconductor die 104 during an electrical bonding process associated with the semiconductor die 104 and the substrate 102. More particularly, the semiconductor die 104 may include multiple die bond pads 108, such as the two rows of die bond pads 108 shown in FIG. 1, and the substrate 102 may include multiple substrate bond pads 110, such as the two rows of substrate bond pads 110 shown in FIG. 1. In some cases, each die bond pad 108 may be electrically connected to a corresponding substrate bond pad 110. For example, each die bond pad 108 may be electrically connected to a substrate bond pad 110 via a bonding wire 112 or a similar conductive connection. In that regard, the hole 106 may expose the die bond pads 108 when the die 104 is attached to the substrate 102 or otherwise disposed on the substrate 102, such that each die bond pad 108 is disposed proximate to a corresponding substrate bond pad 110 and electrically bonded thereto via a correspond bonding wire 112.

As memory devices and other devices incorporating semiconductor packages continue to evolve, semiconductor die may decrease in size. For example, FIG. 1 shows another example semiconductor device 114, which, again, may be a semiconductor package, a semiconductor device assembly, a component of a semiconductor package and/or a semiconductor device assembly, or a device or component otherwise associated with a semiconductor package and/or a semiconductor device assembly. In a similar manner as the semiconductor device 100 described above, the semiconductor device 114 may include a substrate 116, such as a PCB or a component thereof, and one or more semiconductor die 118 electrically bonded to the substrate 116. In that regard, the semiconductor die 118 may include multiple die bond pads 120, such as the two rows of die bond pads 120 shown in FIG. 1, and the substrate 116 may include multiple substrate bond pads 124, such as the two rows of substrate bond pads 124 shown in FIG. 1. Moreover, when the semiconductor die 118 is coupled to the substrate 116, each die bond pad 120 may be exposed by a hole 122 in the substrate 116 and/or may be electrically connected to a corresponding substrate bond pad 124 via a bonding wire 126, in a similar manner as described in connection with the semiconductor device 100.

As shown in FIG. 1, the semiconductor die 118 is smaller than the semiconductor die 104. In that regard and in line with previous techniques to address smaller die sizes, the die bond pads 120 of the semiconductor die 118 are disposed nearer to each other than the die bond pads 108 of the semiconductor die 104, and thus the substrate bond pads 124 are disposed nearer to each other than the substrate bond pads 110 of the semiconductor die 104. This results in an increase in the complexity of a signal trace associated with the substrate 116 and/or the semiconductor die 118. A signal trace (sometimes referred to as a circuit trace, or simply a trace) may refer to a flat, narrow portion of copper foil or other conductive foil that remains after etching a semiconductor component and that is used to conduct electricity within the semiconductor component, such as within the substrate 116 and/or the semiconductor die 118. Increasing the complexity of the trace increases a capacitance of the trace, resulting in attenuated signal inputs to the die bond pads 120 and/or other components of the semiconductor die 118. These attenuated signals caused by the increase in trace capacitance may render high-speed operation of the semiconductor device difficult or impossible. Moreover, placing the die bond pads 120 and/or the substrate bond pads 124 closer to one another (sometimes referred to as decreasing a pitch of the bond pads 120, 124) may increase a difficulty of manufacture. For example, wire bonding equipment may lack the precision to produce high-yield wire bonding at tight bond pad 120, 124 pitches. Moreover, etching bond pads 120, 124 and connecting associated signal traces may be difficult for tight bond pad 120, 124 pitches. Additionally, tight bond pad 120, 124 pitches may lead to parasitic effects, such as parasitic resistance, parasitic capacitance, cross-talk, and similar parasitic effects across the various wire bonding connections.

Some implementations described herein enable a hybrid connection between a semiconductor die and a substrate that reduces trace complexity and thus trace capacitance, thereby improving a signal quality within a semiconductor device and/or improving manufacturability thereof. In some implementations, a semiconductor die may include multiple sets of die bond pads, with a first set of die bond pads being connected to a corresponding set of substrate bond pads using bump bonding (e.g., DCA bonding), and with a second set of die bond pads being connected to a corresponding set of substrate bond pads using wire bonding. Although using both bump bonding and wire bonding to connect a semiconductor die to a substrate may be more expensive and may require more complex manufacturing techniques than using only bump bonding or only wire bonding, this hybrid bonding technique may increase a pitch of bond pads associated with the semiconductor die and/or the substrate, thereby reducing a complexity of a signal trace associated with the semiconductor die and/or the substrate. Simplifying a signal trace associated with the semiconductor die and/or the substrate may reduce signal attenuation and result in improved signal integrity and high-speed operations of an associated semiconductor device. Moreover, increasing a pitch of bond pads associated with the semiconductor die and/or the substrate may increase manufacturability, such as by reducing a required precision of wire bonding equipment and/or by reducing the complexity of etching processes and trace signal manufacturing processes. Moreover, as a result of increasing a pitch of bond pads associated with the semiconductor die and/or the substrate, parasitic effects, such as parasitic resistance, parasitic capacitance, and/or cross-talk across bonding connections, may be reduced or eliminated. These and other benefits may be more readily understood with reference to FIGS. 2A through 3C.

As indicated above, FIG. 1 is provided as an example. Other examples may differ from what is described with regard to FIG. 1.

Figure 2A:
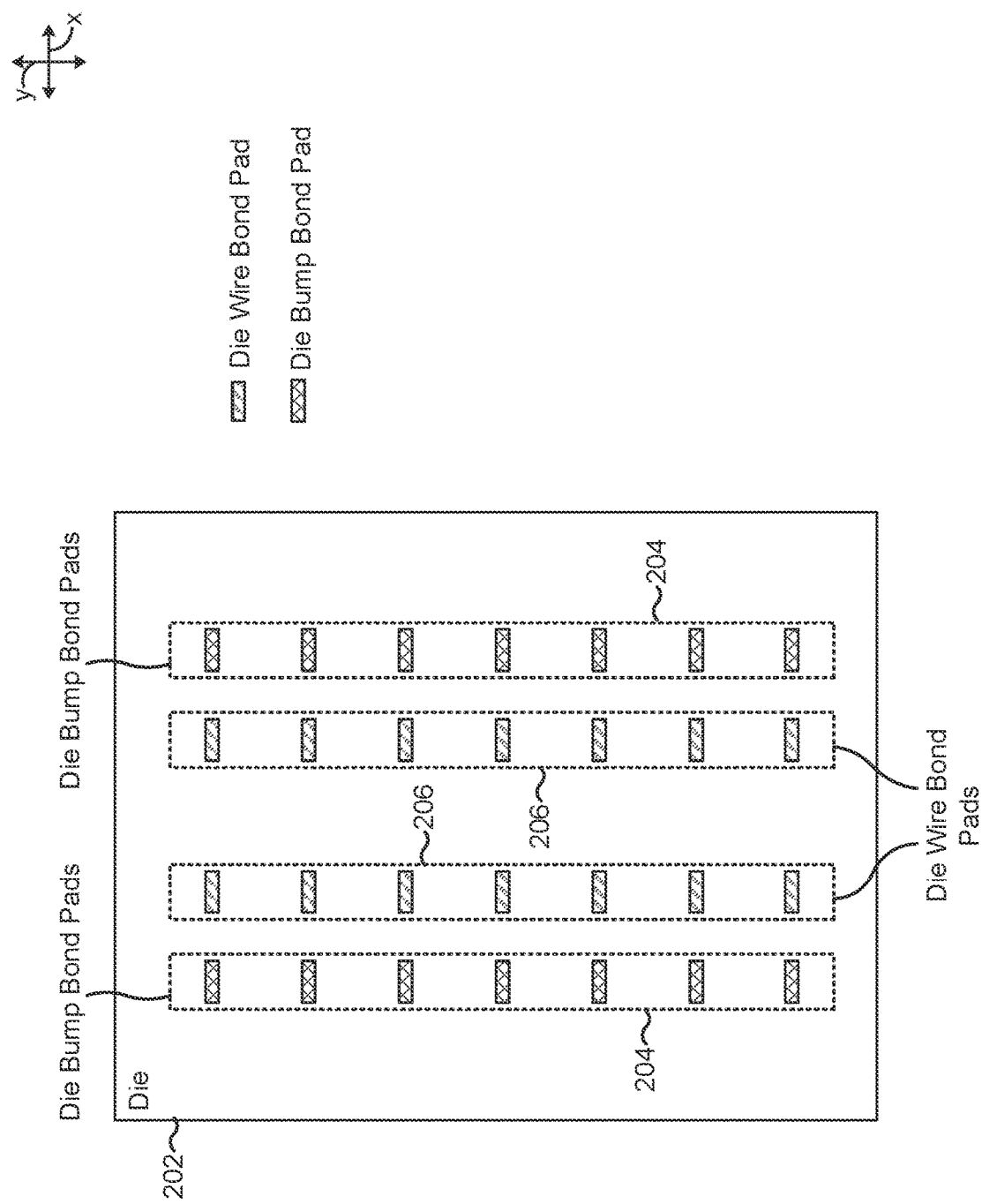
FIGS. 2A-2C are diagrammatic views of an example semiconductor package described herein.
Figure 2B:
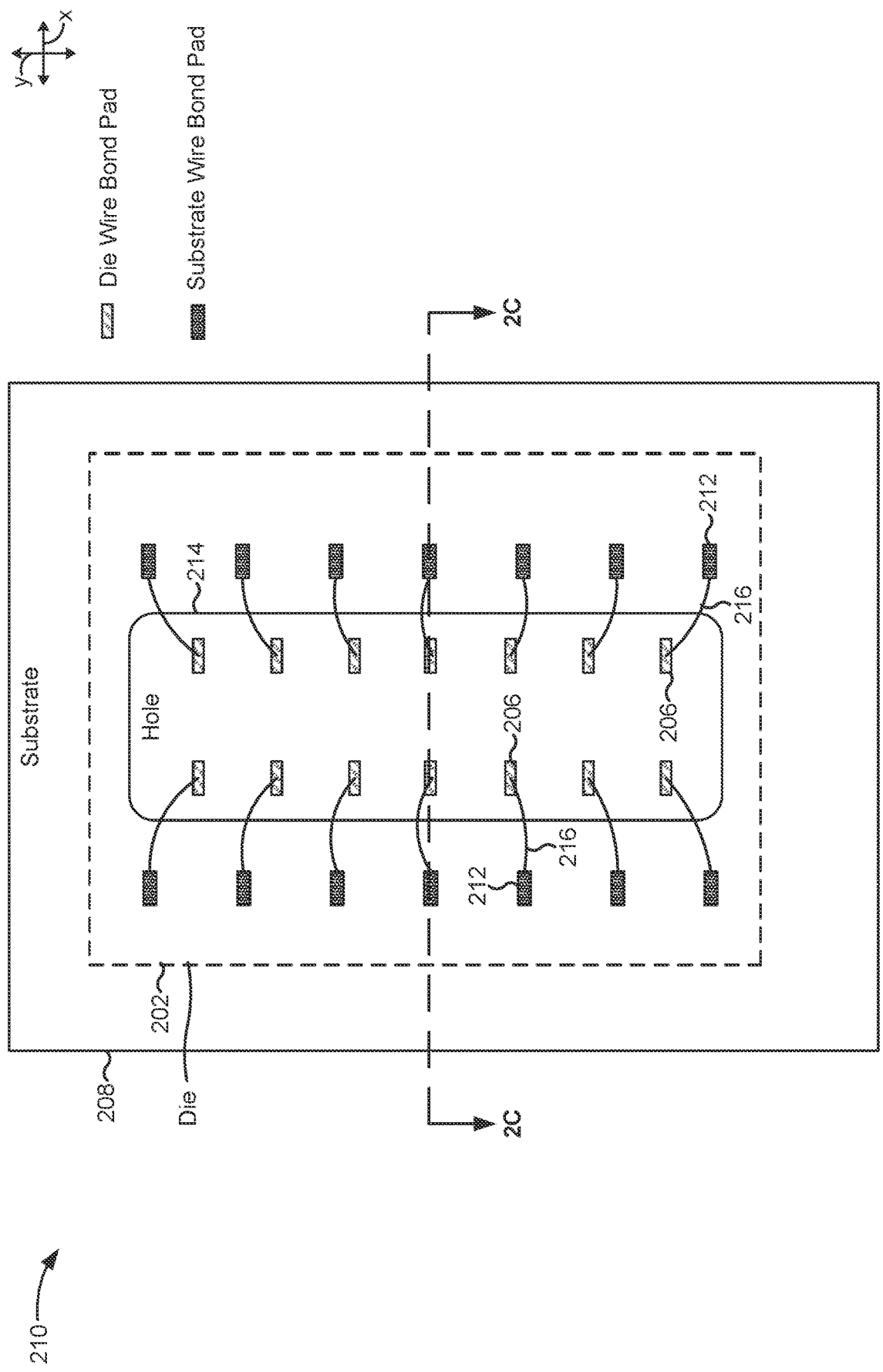
Figure 2C:
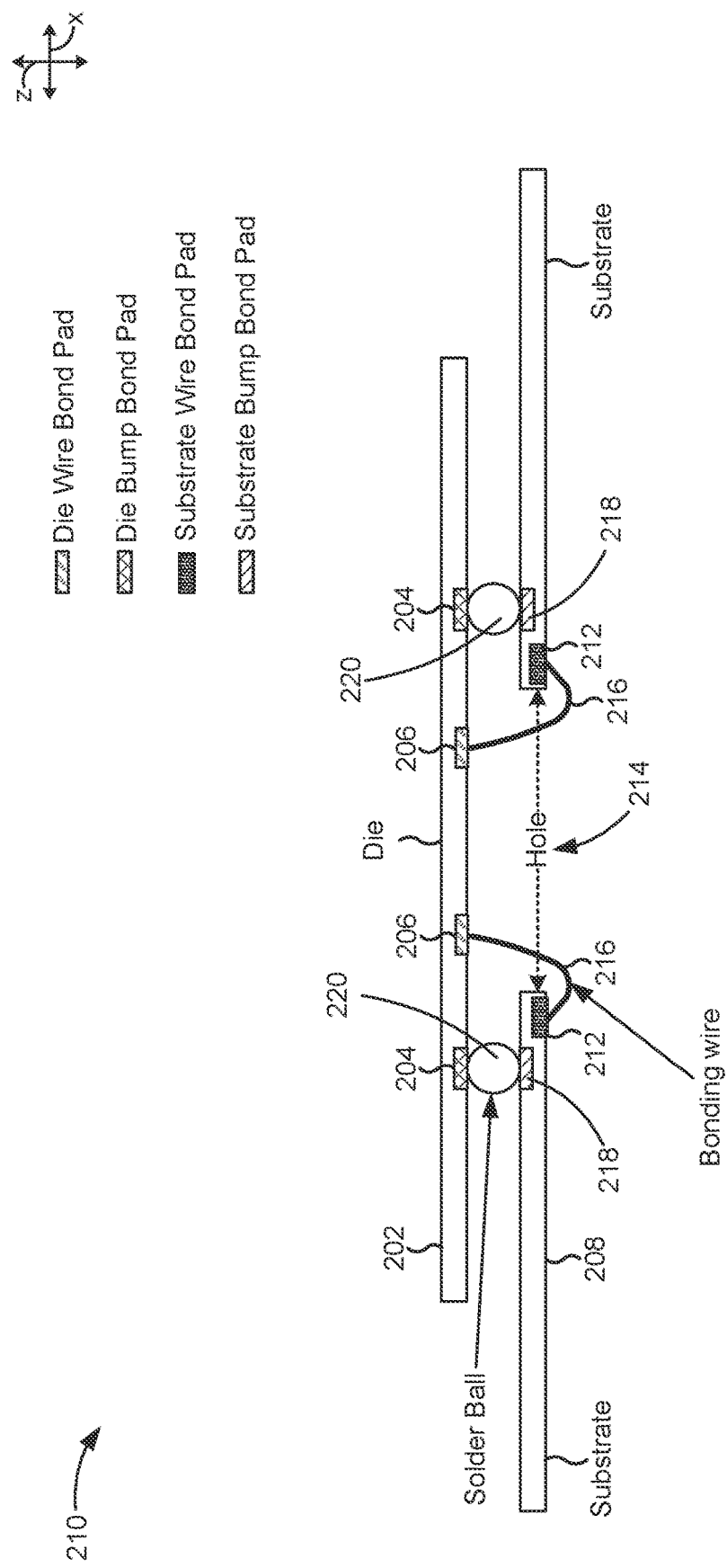

FIGS. 2A-2C are diagrammatic views of an example semiconductor package described herein. FIG. 2A is a bottom view of a semiconductor die. FIG. 2B is a bottom view of a semiconductor package including the semiconductor die of FIG. 2A and a substrate. FIG. 2C is a side cross-sectional view along the line 2C-2C of FIG. 2B. In FIGS. 2A-2C, each of the illustrated x-axis, y-axis, and z-axis is substantially perpendicular to the other two axes. For example, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

First, FIG. 2A shows a semiconductor die 202 (sometimes referred to simply as a die), according to some implementations of the disclosure. In some implementations, the semiconductor die 202 may be a block of semiconducting material (such as silicon, gallium arsenide (GaAs), or other semiconducting material) on which a given functional circuit is fabricated. In that regard, the semiconductor die 202 may form part of a semiconductor package, such as part of an integrated circuit associated with a semiconductor package. In some implementations, the semiconductor die 202 may be diced from a larger wafer. The wafer may include multiple copies of an integrated circuit, formed thereon through processes such as photolithography or the like. The wafer may be diced into multiple semiconductor die, such as the semiconductor die 202 shown in FIG. 2A, with each semiconductor die including a copy of the integrated circuit.

In some implementations, the semiconductor die 202 may include multiple die bond pads. More particularly, the semiconductor die 202 may include a first set of die bond pads, such as a set of die bump bond pads 204, and a second set of die bond pads, such as a set of die wire bond pads 206. In some implementations, the die bump bond pads 204 are used for input signals and/or output signals for the semiconductor die 202, and the die wire bond pads 206 are used for a ground connection and/or a power connection for the semiconductor die 202. Alternatively, the die wire bond pads 206 may be used for input signals and/or output signals for the semiconductor die 202, and the die bump bond pads 204 may be used for a ground connection and/or a power connection for the semiconductor die 202.

In the implementation shown in FIG. 2A, the set of die bump bond pads 204 includes two rows of pads 204, with each row of die bump bond pads 204 including multiple pads 204 arranged in a first direction (e.g., the y-axis direction). In some implementations, the die bump bond pads 204 are evenly spaced from one another along the first direction (e.g., the y-axis direction). Put another way, a pitch between each respective die bump pad 204 is constant. Similarly, the set of die wire bond pads 206 also includes two rows of pads 206, with each row of die wire bond pads 206 including multiple pads 206 arranged in the first direction (e.g., the y-axis direction). In some implementations, the die wire bond pads 206 are also evenly spaced from one another along the first direction (e.g., the y-axis direction).

In some implementations, the two rows of bump bond pads 204 may sandwich the two rows of die wire bond pads 206 therebetween. Put another way, the two rows of die wire bond pads 206 are disposed, in a second direction (e.g., the x-axis direction) perpendicular to the first direction (e.g., the y-axis direction), between the two rows of bump bond pads 204. In that regard, the set of die bump bond pads 204 and the set of die wire bond pads 206 may be offset from one another along the second direction (e.g., the x-axis direction). Moreover, because, in this implementation, the two rows of die wire bond pads 206 are located between the two rows of die bump bond pads 204, a distance between the two rows of die bump bond pads 204, along the second direction (e.g., the x-axis direction), may be greater than a distance between the two rows of die wire bond pads 206 along the second direction. Each of the die bump bond pads 204 and/or the die wire bond pads 206 may be fabricated from a conductive material (such as gold, a gold alloy, or another conductive material) and/or may be a surface area of the semiconductor die 202 that is designated for an external electrical contact (e.g., to electrically couple the semiconductor die 202 to another semiconductor component, such as a substrate, PCB, or the like, which will be described in more detail below in connection with FIGS. 2B-2C).

In some implementations, the die wire bond pads 206 may comprise, consist of, or consist essentially of a different material than the die bump bond pads 204. Additionally, or alternatively, the die wire bond pads 206 may be plated with a different material than the die bump bond pads 204 (or the die bump bond pads 204 may not be plated). For example, the die wire bond pads 206 may be plated with nickel or gold. In some implementations, the die bump bond pads 204 are not plated with nickel or gold. Additionally, or alternatively, the die wire bond pads 206 may be a different size and/or may have at least one different physical dimension (or multiple different physical dimensions) than the die bump bond pads 204. Additionally, or alternatively, the die wire bond pads 206 may have a different shape, a different surface area, and/or a different depth (e.g., within the semiconductor die 202) than the die bump bond pads 204.

In some implementations, a quantity of the die bump bond pads 204 provided on the semiconductor die 202 may be equal to a quantity of the die wire bond pads 206 provided on the semiconductor die 202, as shown in FIG. 2A. Put another way, in some implementations, a total number of bond pads associated with the semiconductor die 202 may be evenly distributed between the die bump bond pads 204 and the die wire bond pads 206. However, in some other implementations, a quantity of the die bump bond pads 204 provided on the semiconductor die 202 may differ from a quantity of the die wire bond pads 206 provided on the semiconductor die 202. For example, in some aspects the semiconductor die 202 may include more die bump bond pads 204 than die wire bond pads 206. In such implementations, each row of die bump bond pads 204 may extend further on the semiconductor die 202 in the first direction (e.g., the y-axis direction) than each row of the die wire bond pads 206. Moreover, in the depicted example each die bump bond pad 204 is aligned, in the second direction (e.g., the x-axis direction), with a corresponding die wire bond pad 206. However, in some other implementations, the die bump bond pads 204 may be misaligned with respect to the die wire bond pads 206 (e.g., at least one die bump bond pad 204 may not align, in the second direction (e.g., the x-axis direction) with any of the die wire bond pads 206).

As shown in FIG. 2B, in some implementations, the semiconductor die 202 may be electrically coupled to a substrate 208 to form a semiconductor device 210. The substrate 208 may be a supporting material upon which other components of the semiconductor device 210, such as the semiconductor die 202, are attached. In some implementations, the substrate 208 may be a PCB or a component thereof. Moreover, the substrate 208 may be formed at least partially from a semiconducting material, such as EGS, GaAs, or a similar semiconducting material, and may include internal conductive components, such as signal traces or the like, as described in connection with FIG. 1.

The semiconductor device 210 may be a semiconductor package, a semiconductor device assembly, a device or a component associated with a semiconductor package or a semiconductor device assembly, or a similar device. In some implementations, the semiconductor device 210 may be a semiconductor package (or otherwise associated with a semiconductor package) that includes the semiconductor die 202 coupled to the substrate 208 and encapsulated in a casing. In that regard, in some implementations, when forming the semiconductor package, in addition to electrically coupling the semiconductor die 202 to the substrate 208 (as described in more detail below), a gap between the semiconductor die 202 and the substrate 208 may be underfilled and/or the semiconductor die 202 may be encapsulated with a molding compound.

In some implementations, the substrate 208 may include multiple layers, such as three or more layers. In such implementations, the substrate 208 may include dielectric material (e.g., epoxy resin with glass fibers) that electrically insulate a layer from one or more adjacent layers. Moreover, each layer may include conductive leads or traces that electrically couple a layer to one or more adjacent layers. In some implementations, the substrate 208 may include one or more outer layers. An outer layer (sometimes referred to as a primary layer) may be a layer of the substrate 208 that forms at least one external surface of the substrate 208, such as the external surface visible in FIG. 2B and/or an opposing external surface visible in the cross-sectional view shown in FIG. 2C. In some implementations, an outer layer may include multiple substrate bond pads for electrically coupling the substrate 208 to the semiconductor die 202, such as substrate wire bond pads 212 and/or substrate bump bond pads 218, which will be described in more detail below.

In some implementations, the substrate 208 may include one or more inner layers (e.g., one or more layers disposed between a pair of outer layers). In some aspects, portions of the one or more inner layers may be exposed by corresponding open areas of the outer layers, such as for purposes of receiving an electrical connection from another semiconductor package component, or the like. More particularly, in some implementations, a portion of a surface of an inner layer that is exposed by an open area in an outer layer may include one or more substrate bond pads, such as substrate wire bond pads 212 and/or substrate bump bond pads 218, for electrically coupling the substrate 208 to another component (e.g., the semiconductor die 202). Additionally, or alternatively, the one or more inner layers may be electrically coupled to the one or more outer layers, such as via signal traces or the like. In some implementations, one or more inner layers may be electrically coupled to bond pads of the one or more outer layers, such as the substrate wire bond pads 212 and/or substrate bump bond pads 218.

In some implementations, the substrate wire bond pads 212 may comprise, consist of, or consist essentially of a different material than the substrate bump bond pads 218. Additionally, or alternatively, the substrate wire bond pads 212 may be plated with a different material than the substrate bump bond pads 218 (or the substrate bump bond pads 218 may not be plated). For example, the substrate wire bond pads 212 may be plated with nickel or gold. In some implementations, the substrate bump bond pads 218 are not plated with nickel or gold. Additionally, or alternatively, the substrate wire bond pads 212 may be a different size and/or may have may have at least one different physical dimension (or multiple different physical dimensions) than the substrate bump bond pads 218. Additionally, or alternatively, the substrate wire bond pads 212 may have a different shape, a different surface area, and/or a different depth (e.g., within the substrate 208) than the substrate bump bond pads 218.

In some implementations, the substrate 208 may include a hole 214 or a similar opening for receiving another semiconductor package component and/or for exposing portions of another semiconductor package component for purposes of electrically coupling the substrate 208 to another semiconductor package component. In some implementations, the hole 214 may extend in the first direction (e.g., the y-axis direction). As shown in FIG. 2B, the hole may expose the die wire bond pads 206 of the semiconductor die 202 when the semiconductor die 202 is coupled to the substrate 208 or otherwise disposed on the substrate 208. That is, the die wire bond pads 206 may be positioned in a region of the semiconductor die 202 that is aligned with the hole 214 of the substrate 208 when the semiconductor die 202 and the substrate 208 are coupled to form the semiconductor device 210.

Moreover, the die bump bond pads 204 may positioned in a region of the semiconductor die 202 that is not aligned with the hole 214 of the substrate 208, but rather faces a surface of the substrate 208 when the semiconductor die 202 and the substrate 208 are coupled to form the semiconductor device 210. Thus, in some implementations, the die wire bond pads 206 may be positioned closer to a center line of the hole 214 (e.g., a center line extending along the y-axis direction) as compared to a position of the die bump bond pads 204. In some implementations, each of the die wire bond pads 206 may be electrically coupled to a corresponding substrate wire bond pad 212 via the hole 214. More particularly, a bonding wire 216 may electrically couple each die wire bond pad 206 to a corresponding substrate wire bond pad 212, with each bonding wire extending through the hole 214, as shown.

The bonding wires 216 may be formed from a conductive material, such as aluminum, copper, silver, gold, or a similar conductive material (e.g., an alloy including one of aluminum, copper, silver, gold, or the like). The bonding wires 216 may be electrically coupled to respective wire bond pads 206, 212 via a welding process (e.g., a solid phase welding process), a soldering process, or a similar process.

In implementations utilizing a soldering process, a solder material, such as a nickel-gold alloy or the like, may be disposed above a wire bond pad 206, 212 (e.g., a wire bond pad 206, 212 may be coated with a conductive solder material), and ends of the bonding wire 216 may be bonded to the wire bond pads 206, 212, such as by heating the bonding wire 216, the wire bond pads 206, 212, and/or the solder material, thereby fusing the ends of the bonding wire 216 to the wire bond pads 206, 212. In implementations utilizing a welding process, two conductive materials (e.g., an end of a bonding wire 216 and a wire bond pad 206, 212) are brought into contact to result in electron sharing or inter-diffusion of atoms to form a wire bond. More particularly, and end of the bonding wire 216 and a respective wire bond pad 206, 212 may be brought together and fused using a combination of downward pressure, ultrasonic energy, or heat.

As best seen by comparing the semiconductor device 210 shown in FIG. 2B with the semiconductor device 114 shown in FIG. 1, fewer wire bonds may need to be performed for the semiconductor device 210 than for the semiconductor device 114. Put another way, fewer die wire bond pads 206 are exposed through the hole 214 of the substrate 208 than are exposed through the hole 122 of the substrate 116. This is because the substrate 208 may also be electrically coupled to the semiconductor die 202 using multiple bump bonds, resulting in a same or more electrical connections as the semiconductor device 114 while using fewer wire bonds. This may be more readily understood with reference to FIG. 2C, which is a side cross-sectional view of the semiconductor device 210 along the line 2C-2C of FIG. 2B.

As shown in FIG. 2C, the substrate 208 may include a plurality of substrate bump bond pads 218. Each substrate bump bond pad 218 may face a corresponding die bump bond pad 204 when the semiconductor die 202 is mounted to the substrate 208 or otherwise disposed on the substrate 208 (e.g., the die bump bond pads 204 are positioned in a region of the semiconductor die 202 that is aligned with a surface of the substrate 208 when the semiconductor die 202 and substrate 208 are coupled to form the semiconductor device 210). In this regard, the substrate bump bond pads 218 may be included on a layer of the substrate 208 that faces a surface of the semiconductor die 202 that includes the die bump bond pads 204 and the die wire bond pads 206, and the substrate wire bond pads 212 may be included on a layer of the substrate 208 that faces away from a surface of the semiconductor die 202 that includes the die bump bond pads 204 and the die wire bond pads 206.

Each substrate bump bond pad 218 may be electrically coupled to a corresponding die bump bond pad 204 via a bump bonding process, or the like. In some implementations, a bump bonding process may include a solder process, which may include placing a solder ball 220 (also referred to as a solder bump) between a die bump bond pad 204 and a substrate bump bond pad 218, and soldering the die bump bond pad 204 and the substrate bump bond pad 218 to one another, such as by heating the solder ball 220 to a melting point, thereby fusing and/or electrically connecting the die bump bond pad 204 to the substrate bump bond pad 218. In some implementations, the use of a solder ball 220 to form a connection between the substrate bump bond pad 218 and the die bump bond pad 204 eliminates the need to use tape or epoxy paste that would otherwise be present and used to affix the semiconductor die 202 to the substrate 208. Thus, in some implementations, tape or epoxy paste may be absent between the semiconductor die 202 and the substrate 208. In some implementations, the wire bonding connections may be used for a different purpose than the bump bonding connections. For example, one of the die bump bond pads 204 or the die wire bond pads 206 may be used for power connections, and the other one of the die bump bond pads 204 or the die wire bond pads 206 may be used for signal connections.

In this way, the semiconductor die 202 is electrically connected to the substrate 208 via a hybrid process: by both wire bonding (via the wire bond pads 206, 212 and the bonding wires 216) and by bump bonding (via the bump bond pads 204, 218 and the solder balls 220). Beneficially, electrically connecting the semiconductor die 202 to the substrate 208 via the hybrid process may increase a pitch between respective bond pads 204, 206, 212, 218 and/or may reduce a complexity of signal traces within the semiconductor die 202 and/or the substrate 208, thereby resulting in improved signal quality and integrity, higher-speed operations for memory devices or similar devices incorporating the semiconductor device 210, increased manufacturability, and decreased parasitic effects.

Although the implementation of the semiconductor device 210 described in connection with FIGS. 2A-2C includes the die wire bond pads 206 being disposed on the same outer surface of the semiconductor die 202 as the die bump bond pads 204 as well as the substrate wire bond pads 212 being disposed on an opposing outer surface of the substrate 208 than the substrate bump bond pads 218, in other embodiments the die wire bond pads 206 and the die bump bond pads 204 may be disposed on opposing outer surfaces of the semiconductor die 202, and/or the substrate wire bond pads 212 and the substrate bump bond pads 218 may be disposed on a same outer surface of the substrate 208. This may be more readily understood with reference to FIGS. 3A-3C, described below.

As indicated above, FIGS. 2A-2C are provided as an example. Other examples may differ from what is described with regard to FIGS. 2A-2C.

Figure 3A:
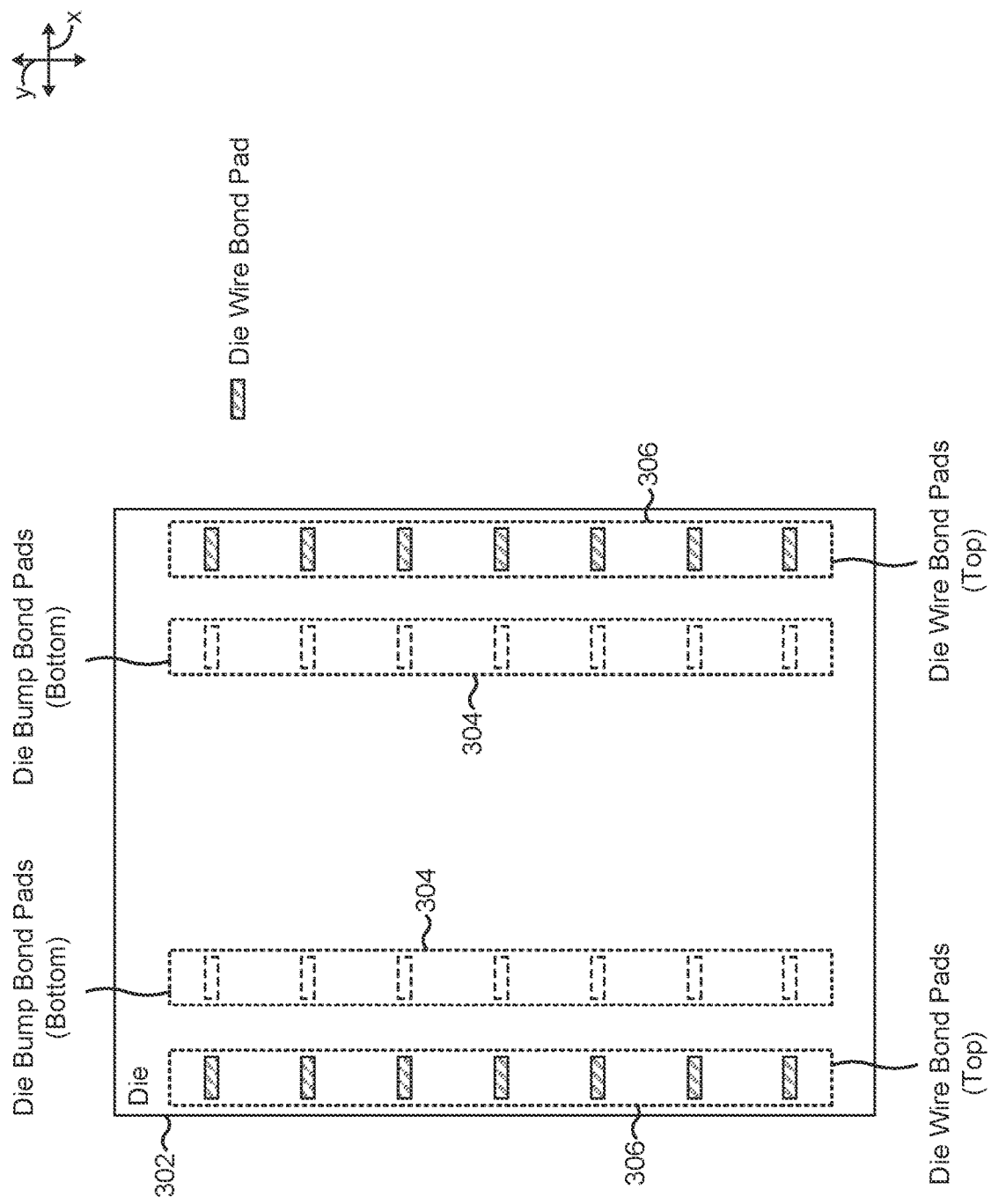
FIGS. 3A-3C are diagrammatic views of another example semiconductor package described herein.
Figure 3B:
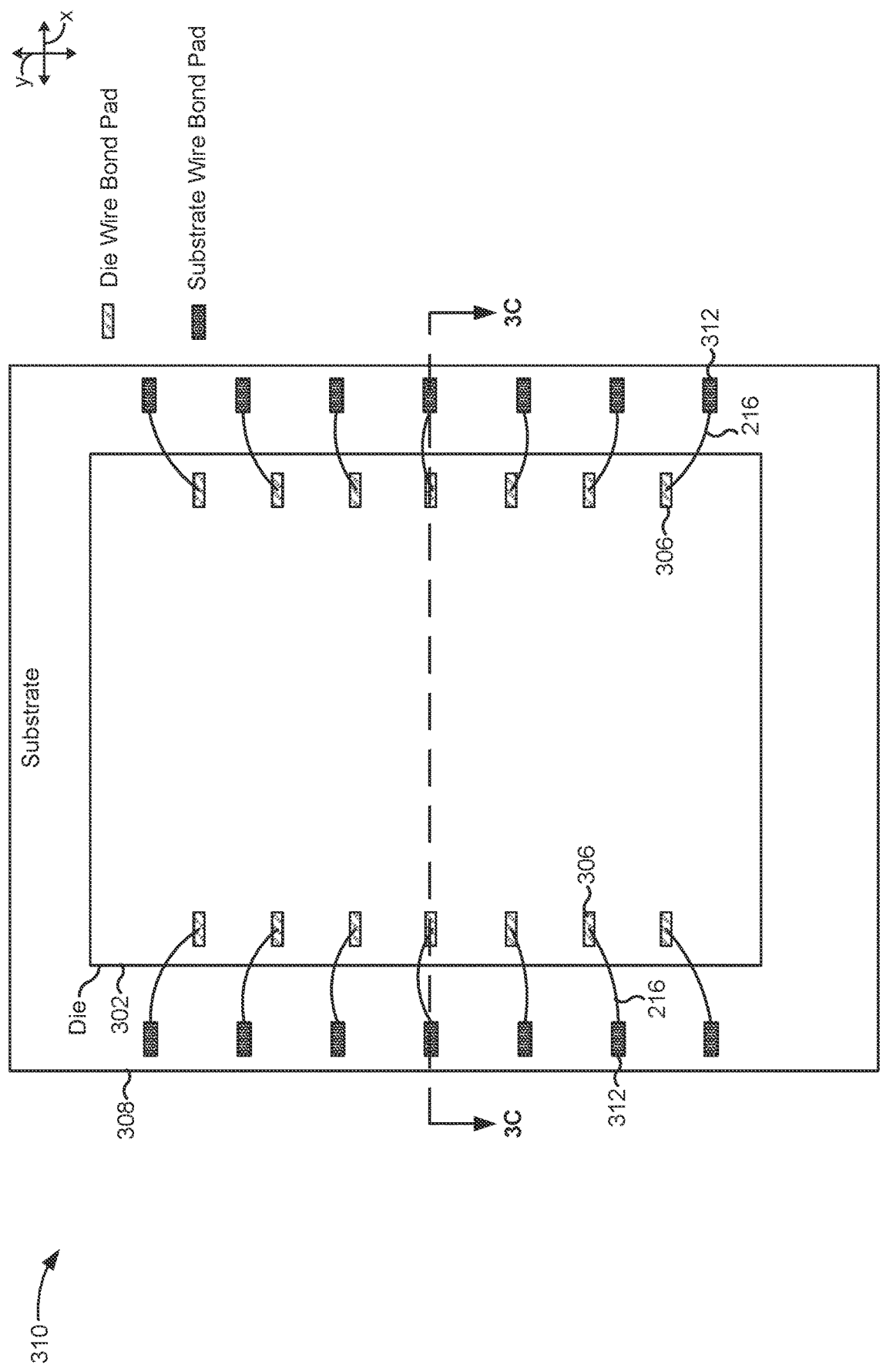
Figure 3C:
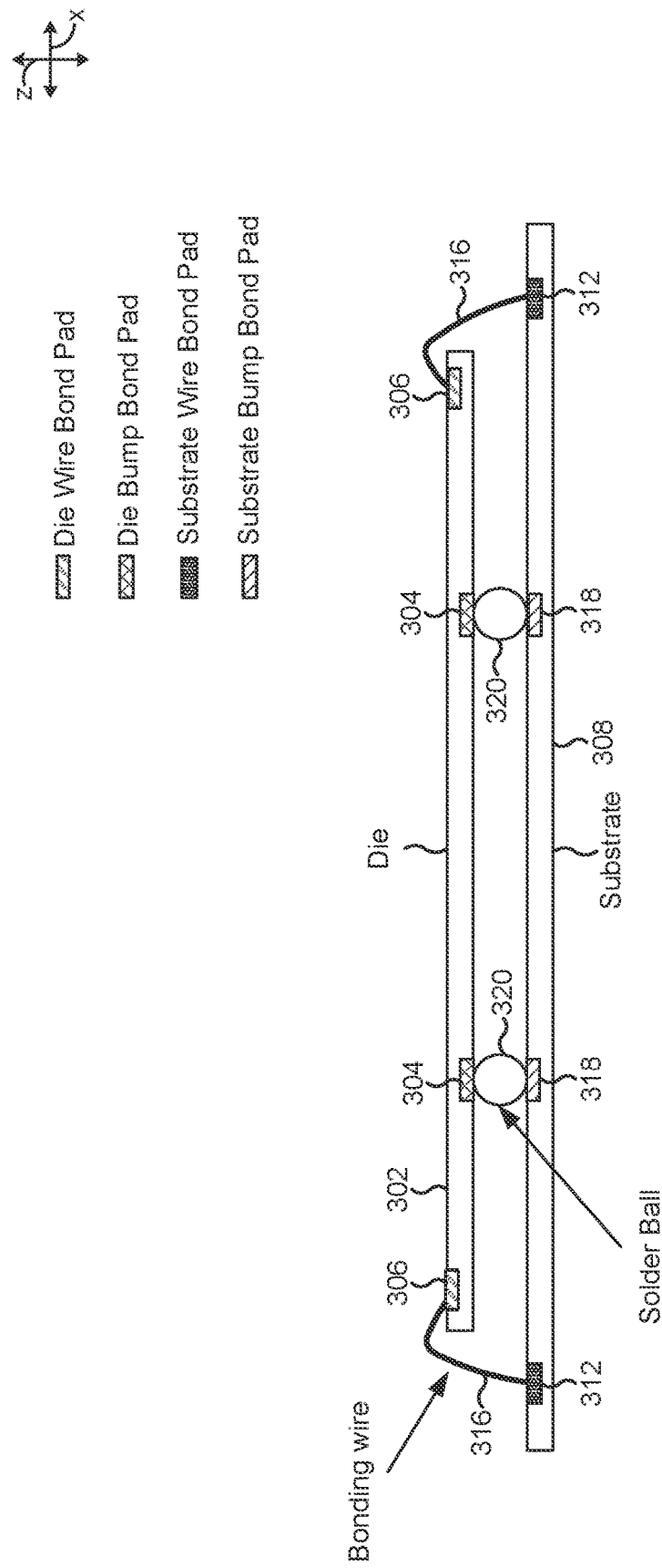

FIGS. 3A-3C are diagrammatic views of another example semiconductor package described herein. FIG. 3A is a view of a semiconductor die. FIG. 3B is a bottom view of a semiconductor package including the semiconductor die of FIG. 3A and a substrate. FIG. 3C is a side cross-sectional view along the line 3C-3C of FIG. 3B. In FIGS. 3A-3C, each of the illustrated x-axis, y-axis, and z-axis is substantially perpendicular to the other two axes. For example, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

First, FIG. 3A shows a semiconductor die 302, according to some implementations of the disclosure. In a similar manner as described above with respect to semiconductor die 202, the semiconductor die 302 may be a block of semiconducting material (such as EGS, GaAs, or other semiconducting material) on which a given functional circuit is fabricated. In that regard, the semiconductor die 302 may form part of a semiconductor package, such as part of an integrated circuit associated with a semiconductor package. In some implementations, the semiconductor die 302 may be diced from a larger wafer. The wafer may include multiple copies of an integrated circuit formed thereon through processes such as photolithography, or the like. The wafer may be diced into multiple semiconductor die, such as the semiconductor die 302 shown in FIG. 3A, with each semiconductor die including a copy of the integrated circuit.

In some implementations, the semiconductor die 302 may include multiple die bond pads. More particularly, the semiconductor die 302 may include a first plurality of die bond pads, such as a set of die bump bond pads 304, and a second plurality of die bond pads, such as a set of die wire bond pads 306. In the implementation shown in FIG. 3A, the set of die bump bond pads 304 includes two rows of pads 304, with each row of die bump bond pads 304 including multiple pads 304 arranged in a first direction (e.g., the y-axis direction). In some implementations, the die bump bond pads 304 are evenly spaced from one another along the first direction (e.g., the y-axis direction). That is, the die bump bond pads 304 may include a constant pitch between each die bump bond pad 304. Similarly, the set of die wire bond pads 306 also includes two rows of pads 306, with each row of die wire bond pads 306 including multiple pads 306 arranged in the first direction (e.g., the y-axis direction). In some implementations, the die wire bond pads 306 are also evenly spaced from one another along the first direction (e.g., the y-axis direction). That is, the die wire bond pads 306 may include a constant pitch between each die wire bond pad 306.

In some implementations, the set of die bump bond pads 304 may be disposed on a different external surface of the semiconductor die 302 than the set of die wire bond pads 306 (e.g., the set of die bump bond pads 304 and the set of die wire bond pads 306 may be disposed on opposing outer surfaces of the semiconductor die 302). More particularly, in some implementations, the set of die bump bond pads 304 may be disposed on one of a top surface or a bottom surface of the semiconductor die 302 (with the die bump bond pads 304 being disposed on the bottom surface of the semiconductor die 302 in the implementation shown in FIG. 3A), and the set of die wire bond pads 306 may be disposed on the other one of the top surface or the bottom surface of the semiconductor die 302 (with the die wire bond pads 306 being disposed on the top surface of the semiconductor die 302 in the implementation shown in FIG. 3A). Put another way, the set of die bump bond pads 304 may be located on a first side or a first layer of the semiconductor die 302, and the die wire bond pads 306 may be positioned on a second side or a second layer of the semiconductor die 302.

In some implementations, the two rows of die wire bond pads 306 may sandwich the two rows of the die bump bond pads 304 therebetween. Put another way, the two rows of die bump bond pads 304 are disposed, in a second direction (e.g., the x-axis direction), between the two rows of die wire bond pads 306. In that regard, the set of die bump bond pads 304 and the set of die wire bond pads 306 may be offset from one another along the second direction (e.g., the x-axis direction) that is perpendicular to the first direction (e.g., the y-axis direction). Moreover, because, in this implementation, the two rows of die bump bond pads 304 are located between the two rows of die wire bond pads 306, a distance between the two rows of die wire bond pads 306, along the second direction (e.g., the x-axis direction), is greater than a distance between the two rows of die bump bond pads 304 along the second direction. Each of the die bump bond pads 304 and/or the die wire bond pads 306 may be fabricated from a conductive material (such as gold, a gold alloy, or another conductive material) and may be a surface area of the semiconductor die 302 that is designated for an external electrical contact (e.g., to electrically couple the semiconductor die 302 to another semiconductor component, such as a substrate, PCB, or the like, which will be described in more detail below in connection with FIGS. 3B-3C).

In some implementations, a quantity of the die bump bond pads 304 provided on the semiconductor die 302 may be equal to a quantity of the die wire bond pads 306 provided on the semiconductor die 302, as shown in FIG. 3A. Put another way, in some implementations, a total number of bond pads associated with the semiconductor die 302 may be evenly distributed between the die bump bond pads 304 and the die wire bond pads 306. However, in some other implementations, a quantity of the die bump bond pads 304 provided on the semiconductor die 302 may differ from a quantity of the die wire bond pads 306 provided on the semiconductor die 302. For example, in some aspects the semiconductor die 302 may include more die bump bond pads 304 than die wire bond pads 306. In such implementations, each row of die bump bond pads 304 may extend further on the semiconductor die 302 in the first direction (e.g., the y-axis direction) than each row of the die wire bond pads 306. Moreover, in depicted example each die bump bond pad 304 is aligned, in the second direction (e.g., the x-axis direction), with a corresponding die wire bond pad 306. However, in some other aspects, the die bump bond pads 304 may be misaligned with respect to the die wire bond pads 306 (e.g., at least one die bump bond pad 304 may not align, in the second direction with any of the die wire bond pads 306).

As shown in FIG. 3B, in some implementations, the semiconductor die 302 may be electrically coupled to a substrate 308 to form a semiconductor device 310. The substrate 308 may be a supporting material upon which other components of the semiconductor device 310, such as the semiconductor die 302, are attached. In some implementations, the substrate 308 may be a PCB or a component thereof. Moreover, the substrate 308 may be formed at least partially from a semiconducting material, such as EGS, GaAs, or a similar semiconducting material, and may include internal conductive components, such as signal traces or the like, as described in connection with FIG. 1.

The semiconductor device 310 may be a semiconductor package, a semiconductor device assembly, a device or a component associated with a semiconductor package or a semiconductor device assembly, or a similar device. In some implementations, the semiconductor device 310 may be a semiconductor package (or otherwise associated with a semiconductor package) that includes the semiconductor die 302 coupled to the substrate 308 and encapsulated in a casing. In that regard, in some implementations, when forming the semiconductor package, in addition to electrically coupling the semiconductor die 302 to the substrate 308 (as described in more detail below), a gap between the semiconductor die 302 and the substrate 308 may be underfilled and/or the semiconductor die 302 may be encapsulated with a molding compound.

In some implementations, and in a similar manner as described above in connection with FIG. 2, the substrate 308 may include multiple layers, such as three or more layers. In such implementations, the substrate 308 may include dielectric material (e.g., epoxy resin with glass fibers) that electrically insulate a layer from one or more adjacent layers. Moreover, each layer may include conductive leads or traces that electrically couple a layer to one or more adjacent layers. The substrate 308 may include one or more outer layers. An outer layer may be a layer of the substrate 308 that forms at least one external surface of the substrate 308, such as the external surface visible in FIG. 3B and an opposing external surface visible in the cross-sectional view shown in FIG. 3C. In some implementations, an outer layer may include multiple substrate bond pads for electrically coupling the substrate 308 to the semiconductor die 302, such as substrate wire bond pads 312 and/or substrate bump bond pads 318, which will be described in more detail below.

In some implementations, and in a similar manner as described above in connection with the substrate 208, the substrate 308 may include one or more inner layers (e.g., one or more layers disposed between a pair of outer layers). In some aspects, the one or more inner layers may be exposed by corresponding open areas of the outer layers, such as for purposes of receiving an electrical connection from another semiconductor package component, or the like. More particularly, in some implementations, a portion of a surface of an inner layer that is exposed by an open area in an outer layer may include one or more substrate bond pads, such as substrate wire bond pads 312 and/or substrate bump bond pads 318, for electrically coupling the substrate 308 to another component (e.g., the semiconductor die 302). Additionally, or alternatively, the one or more inner layers may be electrically coupled to the one or more outer layers, such as via signal traces or the like. In some implementations, one or more inner layers may be electrically coupled to bond pads of the one or more outer layers, such as the substrate wire bond pads 312 and/or substrate bump bond pads 318.

In this implementation, the substrate 308 may omit a hole or similar opening, such as the hole 214 described above in connection with FIGS. 2B-2C. Instead, because the die wire bond pads 306 are disposed on a top surface of the semiconductor die 302 (e.g., a surface of the semiconductor die 302 that faces away from substrate 308 when the semiconductor die 302 is coupled to the substrate 308, as shown in FIG. 3B), a hole or other opening may be omitted from the substrate 308 and the die wire bond pads 306 may nonetheless still be accessible for coupling to the substrate wire bond pads 312, as shown. More particularly, a bonding wire 316 may electrically couple each die wire bond pad 306 to a corresponding substrate wire bond pad 312. Moreover, because the die bump bond pads 306 are disposed on a bottom surface of the semiconductor die 302 (e.g., a surface of the semiconductor die 302 that faces towards from the substrate 308 when the semiconductor die 302 is coupled to the substrate 308 as shown in FIG. 3B), the die bump bond pads 304 may be bump bonded to the substrate 308, and, more particularly, to substrate bump bond pads 318, which will be described in more detail below.

In a similar manner as described above in connection with bonding wires 216, the bonding wires 316 may be formed from a conductive material, such as aluminum, copper, silver, gold, or a similar conductive material (e.g., an alloy including one of aluminum, copper, silver, gold, or the like). The bonding wires 316 may be electrically coupled to respective wire bond pads 306, 312 via a welding process (e.g., a solid phase welding process), a soldering process, or a similar process, as described above. Moreover, as best seen by comparing the semiconductor device 310 shown in FIG. 3B with the semiconductor device 114 shown in FIG. 1, fewer wire bonds may need to be performed for the semiconductor device 310 than for the semiconductor device 114. This is because the substrate 308 may also be electrically coupled to the semiconductor die 302 using multiple bump bonds, resulting in as many or more electrical connections than the semiconductor device 114 using fewer wire bonds. This may be more readily understood with reference to FIG. 3C, which is a side cross-sectional view of the semiconductor device 310 along the line 3C-3C of FIG. 3B.

As shown in FIG. 3C, the substrate 308 may include a plurality of substrate bump bond pads 318. Each substrate bump bond pad 318 may face a corresponding die bump bond pad 304 when the semiconductor die 302 is mounted to the substrate 308 or otherwise disposed on the substrate 308 (e.g., the die bump bond pads 304 are positioned in a region of the semiconductor die 302 that is aligned with a surface of the substrate 308 when the semiconductor die 302 and substrate 308 are coupled to form the semiconductor device 310). In this regard, both the substrate wire bond pads 312 and the substrate bump bond pads 318 may be included on a layer of the substrate 308 that faces a surface of the semiconductor die 302 that includes the die bump bond pads 304 when the semiconductor die 302 and substrate 308 are coupled to form the semiconductor device 310, as shown. Put another way, in some implementations, the substrate bump bond pads 304 and the substrate wire bond pads 306 may be on a same side of the substrate 308.

Each substrate bump bond pad 318 may be electrically coupled to a corresponding die bump bond pad 304, such as via a bump bonding process, or the like. In some implementations, a bump bonding process may include a solder process, which may include placing a solder ball 320 (e.g., a solder bump) between a die bump bond pad 304 and a substrate bump bond pad 318, and soldering the die bump bond pad 304 and the substrate bump bond pad 318 to one another, such as by heating the solder ball 320 to a melting point, thereby fusing and/or electrically connecting the die bump bond pad 304 to the substrate bump bond pad 318. In some implementations, the wire bonding connections may be used for a different purpose than the bump bonding connections. For example, one of the die bump bond pads 304 or the die wire bond pads 306 may be used for power connections, and the other one of the die bump bond pads 304 or the die wire bond pads 306 may be used for signal connections, as described in connection with the die bump bond pads 204 and the die wire bond pads 206 of FIG. 2.

In this way, the semiconductor die 302 is electrically connected to the substrate 308 via a hybrid process: by both wire bonding (via the wire bond pads 306, 312 and the bonding wires 316) and by bump bonding (via the bump bond pads 304, 318 and the solder balls 320). Beneficially, electrically connecting the semiconductor die 302 to the substrate 308 via the hybrid process may increase a pitch between respective bond pads 304, 306, 312, 318 and/or may reduce a complexity of signal traces within the semiconductor die 302 and/or the substrate 308, thereby resulting in improved signal quality and integrity, higher-speed operations for memory devices or similar devices incorporating the semiconductor device 310, increased manufacturability, and decreased parasitic effects.

As indicated above, FIGS. 3A-3C are provided as an example. Other examples may differ from what is described with regard to FIGS. 3A-3C.

Figure 4:
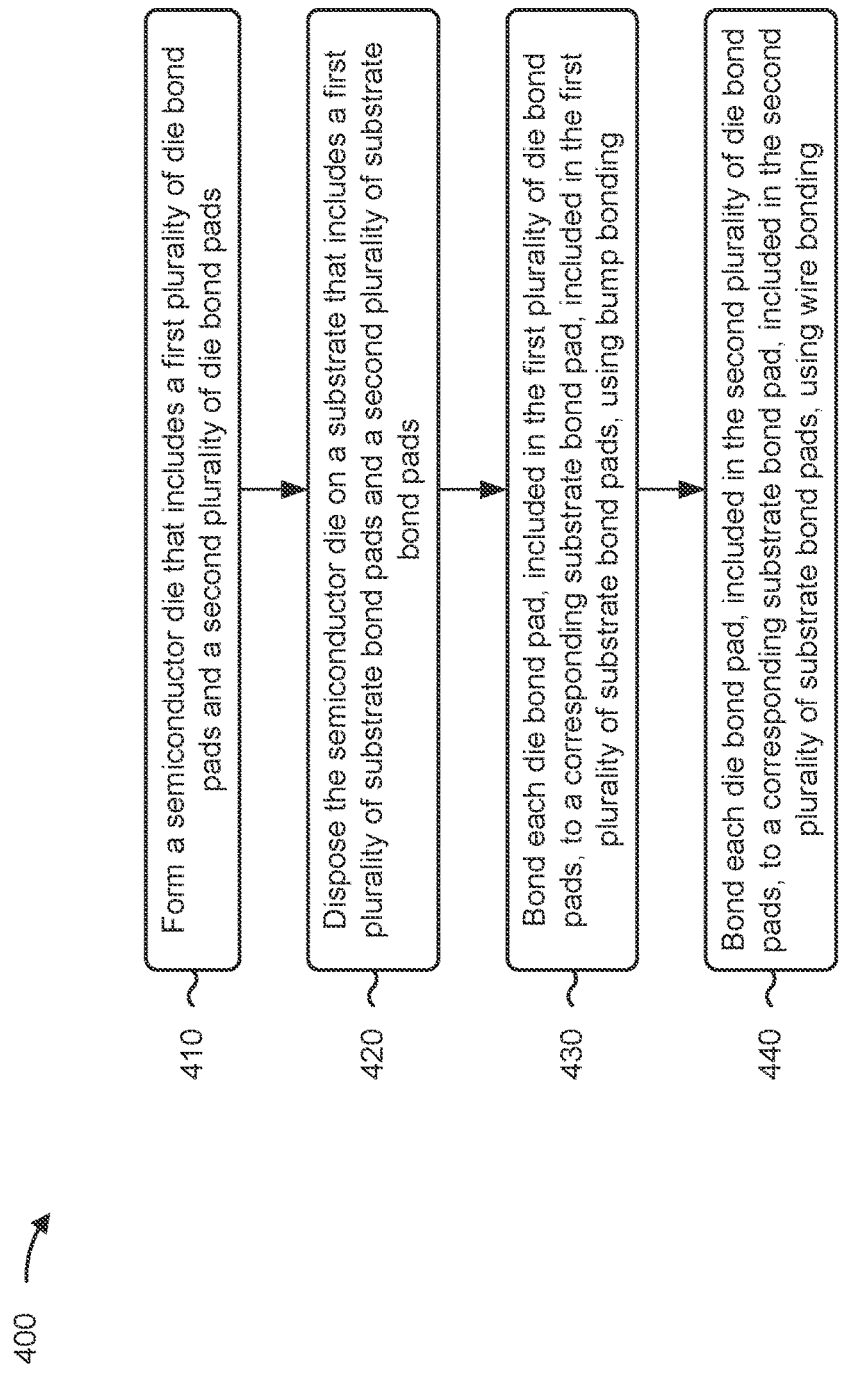
FIG. 4 is a flowchart of an example method of forming a semiconductor package or a semiconductor device assembly having hybrid wire bond and bump bond connections.

FIG. 4 is a flowchart of an example method 400 of forming an integrated assembly or memory device having a semiconductor package with hybrid wire bond and bump bond connections. In some implementations, one or more process blocks of FIG. 4 may be performed by various semiconductor manufacturing equipment.

As shown in FIG. 4, the method 400 may include forming a semiconductor die (e.g., semiconductor die 202, 302) that includes a first plurality of die bond pads (e.g., die bump bond pads 204, 304) and a second plurality of die bond pads (e.g., die wire bond pads 206, 306) (block 410). As further shown in FIG. 4, the method 400 may include disposing the semiconductor die on a substrate (e.g., substrate 208, 308) that includes a first plurality of substrate bond pads (e.g., substrate bump bond pads 218, 318) and a second plurality of substrate bond pads (e.g., substrate wire bond pads 212, 312) (block 420). As further shown in FIG. 4, the method 400 may include bonding each die bond pad, included in the first plurality of die bond pads, to a corresponding substrate bond pad, included in the first plurality of substrate bond pads, using bump bonding (block 430). As further shown in FIG. 4, the method 400 may include bonding each die bond pad, included in the second plurality of die bond pads, to a corresponding substrate bond pad, included in the second plurality of substrate bond pads, using wire bonding (block 440).

The method 400 may include additional implementations, such as any single implementation or any combination of implementations described below and/or in connection with one or more other methods described elsewhere herein.

In some implementations, forming the semiconductor die comprises forming the semiconductor die with the first plurality of die bond pads and the second plurality of die bond pads disposed on a same surface of the semiconductor die (such as described above in connection with semiconductor die 202).

In some implementations, the substrate has a hole (e.g., hole 214) that extends in a first direction (e.g., the y-axis direction), and disposing the semiconductor die on the substrate comprises disposing the semiconductor die on the substrate such that a region that includes the second plurality of die bond pads is disposed in the hole and such that a region that includes the first plurality of die bond pads is disposed on a surface of the substrate.

In some implementations, forming the semiconductor die comprises forming the semiconductor die with the first plurality of die bond pads and the second plurality of die bond pads disposed on different surfaces of the semiconductor die (such as described above in connection with semiconductor die 302).

In some implementations, the method 400 includes underfilling a gap between the semiconductor die and the substrate, and encapsulating the semiconductor die with a molding compound.

Although FIG. 4 shows example blocks of the method 400, in some implementations, the method 400 may include additional blocks, fewer blocks, different blocks, or differently arranged blocks than those depicted in FIG. 4. In some implementations, the method 400 may include forming the semiconductor device 210 and/or the semiconductor device 310, an integrated assembly that includes the semiconductor device 210 and/or the semiconductor device 310, any part described herein of the semiconductor device 210 and/or the semiconductor device 310, and/or any part described herein of an integrated assembly that includes the semiconductor device 210 and/or the semiconductor device 310. For example, the method 400 may include forming one or more of the semiconductor die 202, the substrate 208, the semiconductor device 210, the semiconductor die 302, the substrate 308, and/or the semiconductor device 310.

Figure 5:
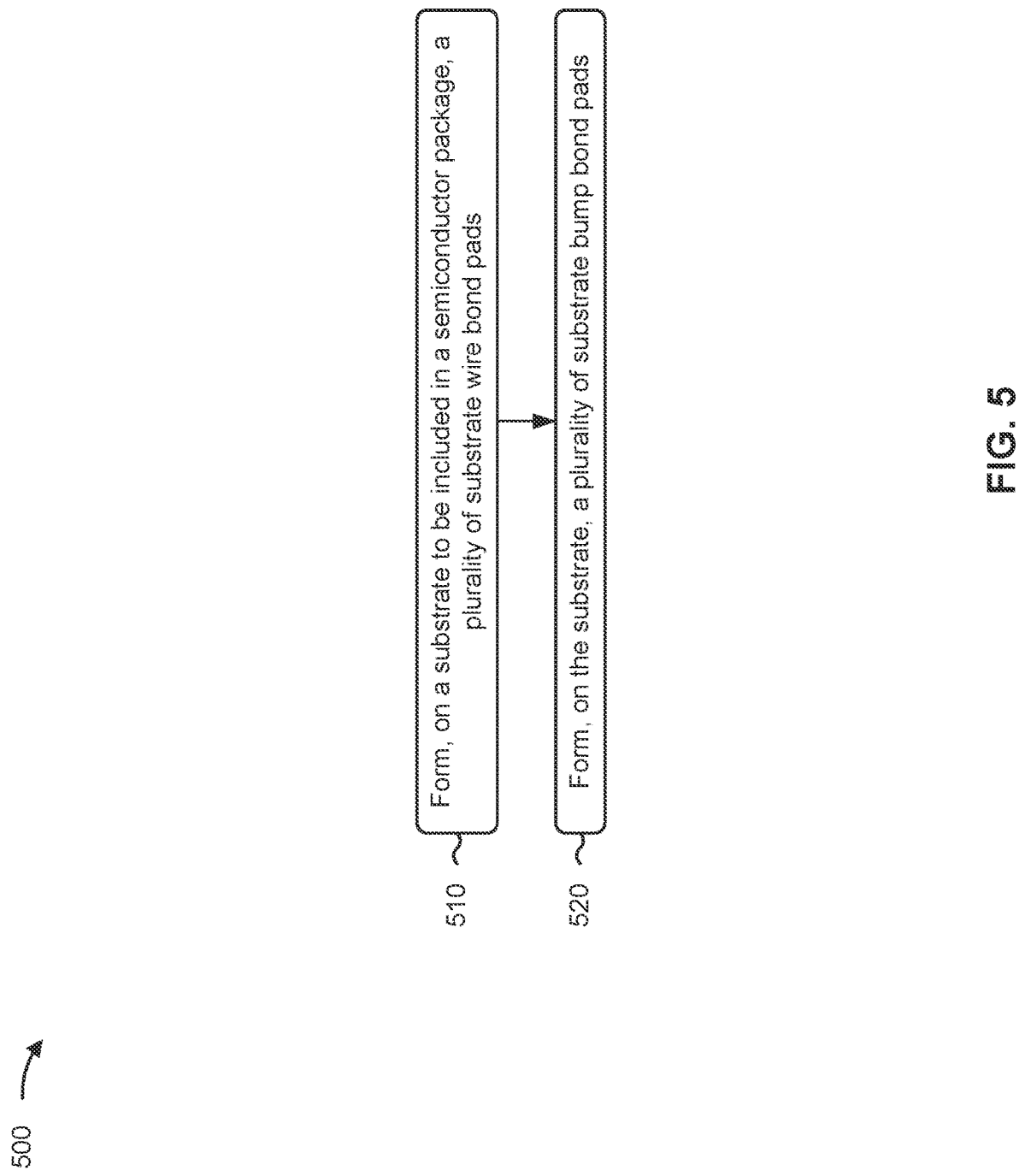
FIG. 5 is a flowchart of an example method of forming a substrate configured for hybrid wire bond and bump bond connections.

FIG. 5 is a flowchart of an example method 500 of forming a substrate configured for hybrid wire bond and bump bond connections. In some implementations, one or more process blocks of FIG. 5 may be performed by various semiconductor manufacturing equipment.

As shown in FIG. 5, the method 500 may include forming, on a substrate to be included in a semiconductor package, a plurality of substrate wire bond pads (block 510). As further shown in FIG. 5, the method 500 may include forming, on the substrate, a plurality of substrate bump bond pads (block 520).

The method 500 may include additional implementations, such as any single implementation or any combination of implementations described below and/or in connection with one or more other methods described elsewhere herein.

In some implementations, the plurality of substrate wire bond pads are formed on a different side of the substrate than the plurality of substrate bump bond pads. In some implementations, the plurality of substrate wire bond pads and the plurality of substrate bump bond pads are formed on a same side of the substrate.

In some implementations, the method 500 includes forming a hole in the substrate, and the plurality of substrate wire bond pads are formed on a different side of the substrate than the plurality of substrate bump bond pads. In some implementations, the substrate does not have a hole, and the plurality of substrate wire bond pads and the plurality of substrate bump bond pads are formed on a same side of the substrate.

In some implementations, the method 500 includes disposing a semiconductor die on the substrate, wherein the semiconductor die includes a plurality of die wire bond pads and a plurality of die bump bond pads. In some implementations, the method 500 includes bonding each die wire bond pad, included in the plurality of die wire bond pads, to a corresponding substrate wire bond pad, included in the plurality of substrate wire bond pads, using wire bonding, and bonding each die bump bond pad, included in the plurality of die bump bond pads, to a corresponding substrate bump bond pad, included in the plurality of substrate bump bond pads, using bump bonding.

In some implementations, the plurality of substrate wire bond pads comprise, consist of, or consist essentially of a different material than the plurality of substrate bump bond pads. In some implementations, the plurality of substrate wire bond pads are plated with a different material than the plurality of substrate bump bond pads. In some implementations, the plurality of substrate wire bond pads are plated with nickel or gold. In some implementations, the plurality of substrate bump bond pads are not plated with nickel or gold. In some implementations, the plurality of substrate wire bond pads have a different size, a different shape, a different surface area, a different depth, or at least one different physical dimension than the plurality of substrate bump bond pads.

Although FIG. 5 shows example blocks of the method 500, in some implementations, the method 500 may include additional blocks, fewer blocks, different blocks, or differently arranged blocks than those depicted in FIG. 5. In some implementations, the method 500 may include forming the substrate 208, the substrate 308, the semiconductor device 210 that includes the substrate 208, the semiconductor device 310 that includes the substrate 308, any part described herein of the substrate 208 (e.g., the substrate wire bond pads 212 and/or the substrate bump bond pads 218), any part described herein of the substrate 308 (e.g., the substrate wire bond pads 312 and/or the substrate bump bond pads 318), any part described herein of the semiconductor device 210 that includes the substrate 208, and/or any part described herein of the semiconductor device 310 that includes the substrate 308.

Figure 6:
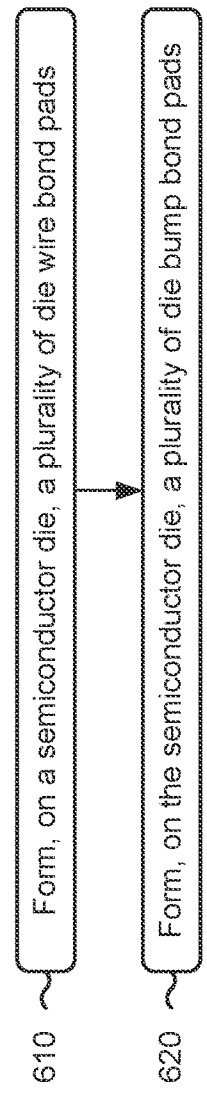
FIG. 6 is a flowchart of an example method of forming a semiconductor die configured for hybrid wire bond and bump bond connections.

FIG. 6 is a flowchart of an example method 600 of forming a semiconductor die configured for hybrid wire bond and bump bond connections. In some implementations, one or more process blocks of FIG. 6 may be performed by various semiconductor manufacturing equipment.

As shown in FIG. 6, the method 600 may include forming, on a semiconductor die, a plurality of die wire bond pads (block 610). As further shown in FIG. 6, the method 600 may include forming, on the semiconductor die, a plurality of die bump bond pads (block 620).

The method 600 may include additional implementations, such as any single implementation or any combination of implementations described below and/or in connection with one or more other methods described elsewhere herein.

In some implementations, the plurality of die wire bond pads are formed on a different side of the semiconductor die than the plurality of die bump bond pads. In some implementations, the plurality of die wire bond pads and the plurality of die bump bond pads are formed on a same side of the semiconductor die.

In some implementations, the method 600 includes disposing the semiconductor die on a substrate, wherein the substrate includes a plurality of substrate wire bond pads and a plurality of substrate bump bond pads. In some implementations, the method 600 includes bonding each die wire bond pad, included in the plurality of die wire bond pads, to a corresponding substrate wire bond pad, included in the plurality of substrate wire bond pads, using wire bonding, and bonding each die bump bond pad, included in the plurality of die bump bond pads, to a corresponding substrate bump bond pad, included in the plurality of substrate bump bond pads, using bump bonding.

In some implementations, the substrate includes a hole in a region of the substrate that is underneath the semiconductor die, the plurality of substrate wire bond pads are formed on a different side of the substrate than the plurality of substrate bump bond pads, the plurality of die wire bond pads and the plurality of die bump bond pads are formed on a same side of the semiconductor die, and wires used to wire bond the plurality of die bump bond pads to the plurality of substrate bump bond pads extend through the hole.

In some implementations, the substrate does not have a hole in a region of the substrate that is underneath the semiconductor die, the plurality of substrate wire bond pads and the plurality of substrate bump bond pads are formed on a same side of the substrate, and the plurality of die wire bond pads are formed on a different side of the semiconductor die than the plurality of die bump bond pads.

In some implementations, the plurality of die wire bond pads comprise, consist of, or consist essentially of a different material than the plurality of die bump bond pads. In some implementations, the plurality of die wire bond pads are plated with a different material than the plurality of die bump bond pads. In some implementations, the plurality of die wire bond pads are plated with nickel or gold. In some implementations, the plurality of die bump bond pads are not plated with nickel or gold. In some implementations, the plurality of die wire bond pads have a different size, a different shape, a different surface area, a different depth, or at least one different physical dimension than the plurality of die bump bond pads.

Although FIG. 6 shows example blocks of the method 600, in some implementations, the method 600 may include additional blocks, fewer blocks, different blocks, or differently arranged blocks than those depicted in FIG. 6. In some implementations, the method 600 may include forming the semiconductor die 202, the semiconductor die 302, the semiconductor device 210 that includes the semiconductor die 202, the semiconductor device 310 that includes the semiconductor die 302, any part described herein of the semiconductor die 202 (e.g., the die wire bond pads 206 and/or the die bump bond pads 204), any part described herein of the semiconductor die 302 (e.g., the die wire bond pads 306 and/or the die bump bond pads 304), any part described herein of the semiconductor device 210 that includes the semiconductor die 202, and/or any part described herein of the semiconductor device 310 that includes the semiconductor die 302.

In some implementations, a semiconductor package includes a substrate having a hole that extends in a first direction, wherein the substrate includes: a first set of substrate bond pads on a first layer of the substrate, and a second set of substrate bond pads on a second layer of the substrate; and a semiconductor die that includes: a first set of die bond pads arranged along the first direction on a surface of the semiconductor die, wherein each die bond pad, of the first set of die bond pads, is connected to a respective substrate bond pad, included in the first set of substrate bond pads, using bump bonding, and a second set of die bond pads arranged along the first direction on the surface of the semiconductor die, wherein each die bond pad, of the second set of die bond pads, is connected to a respective substrate bond pad, included in the second set of substrate bond pads, using wire bonding.

In some implementations, a semiconductor device assembly includes a substrate that includes a first plurality of substrate bond pads and a second plurality of substrate bond pads; and a semiconductor die that includes a first plurality of die bond pads and a second plurality of die bond pads, wherein each die bond pad, included in the first plurality of die bond pads, is connected to a corresponding substrate bond pad, included in the first plurality of substrate bond pads, using bump bonding, and wherein each die bond pad, included in the second plurality of die bond pads, is connected to a corresponding substrate bond pad, included in the second plurality of substrate bond pads, using wire bonding.

In some implementations, a method includes forming a semiconductor die that includes a first plurality of die bond pads and a second plurality of die bond pads; disposing the semiconductor die on a substrate that includes a first plurality of substrate bond pads and a second plurality of substrate bond pads; bonding each die bond pad, included in the first plurality of die bond pads, to a corresponding substrate bond pad, included in the first plurality of substrate bond pads, using bump bonding; and bonding each die bond pad, included in the second plurality of die bond pads, to a corresponding substrate bond pad, included in the second plurality of substrate bond pads, using wire bonding.

In some implementations, a method includes forming, on a substrate to be included in a semiconductor package, a plurality of substrate wire bond pads; and forming, on the substrate, a plurality of substrate bump bond pads.

In some implementations, a method includes forming, on a semiconductor die, a plurality of die wire bond pads; and forming, on the semiconductor die, a plurality of die bump bond pads.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings. As used herein, the term "substantially" means "within reasonable tolerances of manufacturing and measurement."

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:
1. A semiconductor package, comprising:
   a substrate having a hole that extends in a first direction, wherein the substrate includes:
      a first set of substrate bond pads on a first layer of the substrate, and a second set of substrate bond pads on a second layer of the substrate; and
a semiconductor die that includes:
a first set of die bond pads arranged along the first direction on a surface of the semiconductor die,
wherein each die bond pad, of the first set of die bond pads, is connected to a respective substrate bond pad, included in the first set of substrate bond pads, using bump bonding, and
wherein each die bond pad, of the first set of die bond pads, comprises a first material,
a second set of die bond pads arranged along the first direction on the surface of the semiconductor die,
wherein each die bond pad, of the second set of die bond pads, is connected to a respective substrate bond pad, included in the second set of substrate bond pads, using wire bonding, and
wherein each die bond pad, of the second set of die bond pads, comprises a second material different than the first material.

2. The semiconductor package of claim 1,
wherein the first set of die bond pads and the second set of die bond pads are offset from one another along a second direction that is perpendicular to the first direction.

3. The semiconductor package of claim 1,
wherein the first layer of the substrate faces the surface of the semiconductor die, and wherein the second layer of the substrate faces away from the surface of the semiconductor die.

4. The semiconductor package of claim 1,
wherein the second set of die bond pads are positioned in a region of the semiconductor die that is aligned with the hole of the substrate.

5. The semiconductor package of claim 1,
wherein the first set of die bond pads are positioned in a region of the semiconductor die that is aligned with a surface of the substrate.

6. The semiconductor package of claim 1,
wherein the first set of die bond pads includes two rows of bump bond pads, and wherein the second set of die bond pads includes two rows of wire bond pads.

7. The semiconductor package of claim 6,
wherein a distance between the two rows of bump bond pads, along a second direction that is perpendicular to the first direction, is greater than a distance between the two rows of wire bond pads along the second direction.

8. The semiconductor package of claim 1,
wherein the second set of die bond pads are positioned closer to a center line of the hole than the first set of die bond pads, wherein the center line extends along the first direction.

9. The semiconductor package of claim 1,
wherein the second set of die bond pads are evenly spaced from one another along the first direction.

10. A semiconductor device assembly, comprising:
a substrate that includes a first plurality of substrate bond pads and a second plurality of substrate bond pads; and
a semiconductor die that includes a first plurality of die bond pads and a second plurality of die bond pads,
wherein each die bond pad, included in the first plurality of die bond pads, is connected to a corresponding substrate bond pad, included in the first plurality of substrate bond pads, using bump bonding,
wherein each die bond pad, included in the first plurality of die bond pads, comprises a first material,
wherein the first plurality of die bond pads is used for a first type of connections,
wherein each die bond pad, included in the second plurality of die bond pads, is connected to a corresponding substrate bond pad, included in the second plurality of substrate bond pads, using wire bonding,
wherein each die bond pad, included in the second plurality of die bond pads, comprises a second material different than the first material, and
wherein the second plurality of die bond pads is used for a second type of connections different than the first type of connections.

11. The semiconductor device assembly of claim 10,
wherein the first plurality of die bond pads and the second plurality of die bond pads are on a same side of the semiconductor die.

12. The semiconductor device assembly of claim 11,
wherein the second plurality of die bond pads are positioned in a region of the semiconductor die that is aligned with a hole of the substrate.

13. The semiconductor device assembly of claim 11,
wherein the first plurality of substrate bond pads are located on a first side or a first layer of the substrate, and wherein the second plurality of substrate bond pads are positioned on a second side or a second layer of the substrate.

14. The semiconductor device assembly of claim 13,
wherein the first side or the first layer faces the semiconductor die.

15. The semiconductor device assembly of claim 10,
wherein the first plurality of die bond pads are located on a first side or a first layer of the semiconductor die, and wherein the second plurality of die bond pads are positioned on a second side or a second layer of the semiconductor die.

16. The semiconductor device assembly of claim 15,
wherein the first plurality of substrate bond pads and the second plurality of substrate bond pads are on a same side of the substrate.

17. The semiconductor device assembly of claim 15,
wherein the first plurality of die bond pads includes two rows of bump bond pads, and wherein the second plurality of die bond pads includes two rows of wire bond pads.

18. The semiconductor device assembly of claim 17,
wherein a distance between the two rows of bump bond pads is less than a distance between the two rows of wire bond pads.

19. The semiconductor device assembly of claim 10,
wherein the first type of connections includes power connections or signal connections, and the second type of connections includes the other of the signal connections or the power connections.

20. The semiconductor device assembly of claim 10,
wherein a quantity of the first plurality of die bond pads is equal to a quantity of the second plurality of die bond pads.

21. A semiconductor package, comprising:
a substrate that includes a first plurality of substrate bond pads on a first layer of the substrate and a second plurality of substrate bond pads on a second layer of the substrate; and
a semiconductor die that includes a first plurality of die bond pads and a second plurality of die bond pads, wherein each die bond pad, of the first plurality of die bond pads, is connected to a respective substrate bond pad, of the first plurality of substrate bond pads, using bump bonding, wherein each die bond pad, of the first plurality of die bond pads, comprises a first material, wherein each die bond pad, of the second plurality of die bond pads, is connected to a respective substrate bond pad, of the second plurality of substrate bond pads, using wire bonding, and wherein each die bond pad, of the second plurality of die bond pads, comprises a second material different than the first material.

22. The semiconductor package of claim 21,
wherein the first layer of the substrate faces a surface of the semiconductor die and the second layer of the substrate faces away from the surface of the semiconductor die.

23. The semiconductor package of claim 21,
wherein the substrate has a hole that extends in a first direction.

24. The semiconductor package of claim 23,
wherein the first plurality of die bond pads and the second plurality of die bond pads extend along the first direction.

25. The semiconductor package of claim 23, wherein:
the substrate includes a third plurality of substrate bond pads on the first layer of the substrate and a fourth plurality of substrate bond pads on the second layer of the substrate, and
the semiconductor die includes a third plurality of die bond pads and a fourth plurality of die bond pads on an opposite side of the hole from the first plurality of die bond pads and the second plurality of die bond pads.

* * * * *